US011164915B2

(12) United States Patent
Lee et al.

(10) Patent No.: US 11,164,915 B2
(45) Date of Patent: Nov. 2, 2021

(54) DISPLAY DEVICE INCLUDING AN INPUT SENSING CIRCUIT HAVING DUMMY PATTERNS

(71) Applicant: SAMSUNG DISPLAY CO., LTD., Yongin-si (KR)

(72) Inventors: Kyungsoo Lee, Suwon-si (KR); Il-Joo Kim, Hwaseong-si (KR); Jong-Hwa Kim, Seoul (KR); Jeongyun Han, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/439,245

(22) Filed: Jun. 12, 2019

(65) Prior Publication Data
US 2020/0043984 A1 Feb. 6, 2020

(30) Foreign Application Priority Data
Aug. 6, 2018 (KR) .......................... 10-2018-0091199

(51) Int. Cl.
*G06F 3/041* (2006.01)
*H01L 27/32* (2006.01)
*G06F 3/044* (2006.01)

(52) U.S. Cl.
CPC ............ *H01L 27/323* (2013.01); *G06F 3/044* (2013.01); *G06F 3/0412* (2013.01);
(Continued)

(58) Field of Classification Search
CPC ............... H01L 27/3223; H01L 27/323; H01L 27/3276; H01L 27/3244; G06F 3/044; G06F 3/0412; G06F 3/0443; G06F 3/0416

See application file for complete search history.

(56) References Cited

U.S. PATENT DOCUMENTS 10,146,377 B2 12/2018 Park et al.
2009/0315854 A1* 12/2009 Matsuo .................. G06F 3/044
345/174

(Continued)

FOREIGN PATENT DOCUMENTS

KR 10-1082293 11/2011
KR 10-2016-0072909 6/2016
(Continued)

*Primary Examiner* — Adam J Snyder
(74) *Attorney, Agent, or Firm* — F. Chau & Associates, LLC

(57) ABSTRACT

A display device includes a display panel including a display region and a non-display region, and an input sensing circuit disposed on the display panel. The input sensing circuit includes a plurality of sensors overlapping the display region and including a plurality of first sensors and a plurality of second sensors capacitive-coupled respectively to adjacent first sensors among the plurality of first sensors, a dummy line disposed on a periphery of the plurality of sensors, extending along a part of a boundary between the display region and the non-display region, and insulated from the plurality of sensors, and a plurality of dummy patterns insulated from the plurality of sensors. Each of the plurality of dummy patterns is disposed between two adjacent sensors among the plurality of sensors, and at least a portion of the plurality of dummy patterns is electrically connected to the dummy line.

19 Claims, 13 Drawing Sheets

(52) U.S. Cl.
CPC ...... *H01L 27/3223* (2013.01); *H01L 27/3276* (2013.01); *G06F 3/0416* (2013.01); *G06F 3/0443* (2019.05); *H01L 27/3244* (2013.01)

(56) References Cited

U.S. PATENT DOCUMENTS

| | | | | |
|---|---|---|---|---|
| 2010/0073319 | A1* | 3/2010 | Lyon | G06F 3/044 345/174 |
| 2011/0057893 | A1 | 3/2011 | Kim et al. | |
| 2013/0249863 | A1* | 9/2013 | Misaki | G06F 3/044 345/174 |
| 2013/0257785 | A1* | 10/2013 | Brown | G06F 3/044 345/174 |
| 2014/0070875 | A1* | 3/2014 | Dunphy | G06F 3/0446 327/517 |
| 2014/0176465 | A1* | 6/2014 | Ma | G06F 3/041 345/173 |
| 2015/0002458 | A1* | 1/2015 | Lee | G06F 3/0418 345/174 |
| 2015/0220191 | A1* | 8/2015 | Huh | G06F 3/0446 345/173 |
| 2015/0220193 | A1* | 8/2015 | Choe | G06F 3/0412 345/174 |
| 2015/0277635 | A1* | 10/2015 | Kim | G06F 3/047 345/173 |
| 2016/0202789 | A1 | 7/2016 | Kim et al. | |
| 2016/0202814 | A1* | 7/2016 | Lee | G06F 3/0412 345/173 |
| 2016/0313860 | A1* | 10/2016 | Ono | G06F 3/044 |
| 2017/0286740 | A1* | 10/2017 | Liu | G06F 3/0443 |
| 2018/0011563 | A1 | 1/2018 | Won et al. | |
| 2018/0267665 | A1* | 9/2018 | Fujisawa | G06F 3/044 |
| 2019/0079622 | A1* | 3/2019 | Choi | G06F 3/0412 |
| 2019/0265824 | A1* | 8/2019 | Abe | G06F 3/044 |
| 2019/0286272 | A1* | 9/2019 | Feng | G06F 3/0418 |
| 2019/0331952 | A1* | 10/2019 | Teranishi | G06F 3/0446 |

FOREIGN PATENT DOCUMENTS

| | | |
|---|---|---|
| KR | 10-2016-0086528 | 7/2016 |
| KR | 10-2016-0091178 | 8/2016 |
| KR | 10-2017-0046573 | 5/2017 |
| KR | 10-2018-0006529 | 1/2018 |

* cited by examiner

DISPLAY DEVICE INCLUDING AN INPUT SENSING CIRCUIT HAVING DUMMY PATTERNS

CROSS-REFERENCE TO RELATED APPLICATION

This patent application claims priority under 35 U.S.C. § 119 to Korean Patent Application No. 10-2018-0091199, filed on Aug. 6, 2018 in the Korean Intellectual Property Office, the disclosure of which is incorporated by reference herein in its entirety.

TECHNICAL FIELD

Exemplary embodiments of the inventive concept herein relate to a display device having a partially curved display region, and more particularly, to a display device having an excellent ability to sense an externally applied input.

DISCUSSION OF RELATED ART

Various display devices for use in multimedia devices such as televisions, mobile phones, tablet computers, navigators, game machines, or the like are being developed. Input devices of display devices may include a keyboard, a mouse, or the like. Furthermore, display devices may include an input sensing circuit as an input device.

Display devices may recognize, through the input sensing circuit, a human finger or the like contacting a screen thereof. A touch detection method for the input sensing circuit includes a variety of methods such as a resistive method, an optical method, a capacitive method, an ultrasonic method, etc. Here, according to the capacitive method, it is determined whether a touch occurs by using a capacitance which varies when a touch generating means comes into contact with the screen of the display device.

A display region of the device may have not only a rectangular shape but also a curved shape. Due to such a modified shape, some of the sensors included in the input sensing circuit are cut resulting in a partial region. Therefore, the partial region of the input sensing circuit may have different input detection sensitivity from another region that is not cut.

SUMMARY

According to an exemplary embodiment of the inventive concept, a display device includes a display panel including a display region and a non-display region and an input sensing circuit disposed on the display panel. The input sensing circuit may include a plurality of sensors, a dummy line, and a plurality of dummy patterns. The plurality of sensors may overlap the display region and may include a plurality of first sensors and a plurality of second sensors capacitive-coupled respectively to adjacent first sensors among the plurality of first sensors. The dummy line may be disposed on a periphery of the plurality of sensors, may extend along a part of a boundary between the display region and the non-display region, and may be insulated from the plurality of sensors. The plurality of dummy patterns may be insulated from the plurality of sensors. Each of the plurality of dummy patterns may be disposed between two adjacent sensors among the plurality of sensors, and at least a portion of the plurality of dummy patterns may be electrically connected to the dummy line.

In an exemplary embodiment of the inventive concept, the dummy line may overlap the non-display region.

In an exemplary embodiment of the inventive concept, an area of at least one sensor adjacent to the boundary between the display region and the non-display region, among the plurality of sensors, may be about 10 percent to about 49 percent of an area of other sensors among the plurality of sensors.

In an exemplary embodiment of the inventive concept, the display region may include a first display region having a first area, a second display region having a second area smaller than the first area and extending from the first display region, and a third display region having a third area smaller than the first area, extending from the first display region, and spaced apart from the second display region.

In an exemplary embodiment of the inventive concept, the input sensing circuit may include a first input sensing region overlapping the first display region, a second input sensing region overlapping the second display region, and a third input sensing region overlapping the third display region. The dummy line may be disposed between the second input sensing region and the third input sensing region.

In an exemplary embodiment of the inventive concept, the input sensing circuit may further include a connection line connecting one sensor disposed in the second input sensing region among the plurality of sensors to one sensor disposed in the third input sensing region among the plurality of sensors.

In an exemplary embodiment of the inventive concept, a direction in which the connection line extends may be substantially the same as a direction in which the dummy line extends.

In an exemplary embodiment of the inventive concept, the dummy line may be disposed adjacent to the connection line.

In an exemplary embodiment of the inventive concept, the dummy line may be disposed between the connection line and the plurality of sensors.

In an exemplary embodiment of the inventive concept, the dummy line may include molybdenum, and the plurality of sensors and the plurality of dummy patterns may include indium tin oxide.

According to an exemplary embodiment of the inventive concept, a display device includes a display panel, a dummy line, an insulating layer, a sensor unit, and a plurality of dummy patterns. The display panel may include a display region and a non-display region. The dummy line may be disposed on the display panel, may overlap the non-display region, and may extend along a part of a boundary between the display region and the non-display region. The insulating layer may cover the dummy line, may be disposed on the display panel, and may include a contact hole exposing a part of the dummy line. The sensor unit may include a plurality of sensors disposed on the insulating layer, where each of the plurality of sensors may be capacitive-coupled to adjacent other sensors of the plurality of sensors. Each of the plurality of dummy patterns may be disposed between adjacent sensors among the plurality of sensors that are insulated from another. At least a portion of the plurality of dummy patterns may be electrically connected to the dummy line via the contact hole.

In an exemplary embodiment of the inventive concept, the dummy line may be insulated from the plurality of sensors.

In an exemplary embodiment of the inventive concept, the plurality of sensors may include a plurality of first normal sensors, each of which has a first area, a plurality of second normal sensors, each of which has a second area which is about half of the first area, and a plurality of atypical sensors, each of which has a third area different from the first area and the second area.

In an exemplary embodiment of the inventive concept, the display region may include a first display region, a second display region extending from the first display region, and a third display region extending from the first display region and spaced apart from the second display region.

In an exemplary embodiment of the inventive concept, the display device may further include a connection line disposed on the display panel, covered by the insulating layer, and connecting one sensor overlapping the second display region among the plurality of sensors to one sensor overlapping the third display region among the plurality of sensors.

In an exemplary embodiment of the inventive concept, a direction in which the connection line extends may be substantially the same as a direction in which the dummy line extends.

In an exemplary embodiment of the inventive concept, the dummy line may be disposed adjacent to the connection line.

In an exemplary embodiment of the inventive concept, the dummy line may be disposed between the connection line and the plurality of sensors.

In an exemplary embodiment of the inventive concept, the plurality of atypical sensors may be arranged adjacent to a periphery of the sensor unit.

In an exemplary embodiment of the inventive concept, the dummy line may be disposed adjacent to the plurality of atypical sensors.

According to an exemplary embodiment of the inventive concept, a display device includes a display panel, a dummy line, first sensors, second sensors, a dummy pattern, a first connection part, and a second connection part. The first sensors may be disposed on the display panel and include a left first sensor and a right first sensor opposite to the left first sensor. The second sensors may be disposed on the display panel and include an upper second sensor and a lower second sensor opposite to the upper second sensor, where the upper second sensor and the lower second sensor are capacitive-coupled to the left first sensor and the right first sensor. The dummy pattern may be disposed on the display panel and disposed between the left first sensor and the upper second sensor, between the upper second sensor and the right first sensor, between the right first sensor and the lower second sensor, and between the lower second sensor and the left first sensor. The first connection part may include an opening and electrically connect the left first sensor and the right first sensor. The second connection part may include a pattern disposed in the opening of the first connection part, where the pattern electrically connects the upper second sensor and the lower second sensor. At least a portion of the dummy pattern may be electrically connected to the dummy line.

BRIEF DESCRIPTION OF THE FIGURES

The above and other features of the inventive concept will become more apparent by describing in detail exemplary embodiments thereof with reference to the accompanying drawings.

DETAILED DESCRIPTION OF THE EMBODIMENTS

Figure 1:
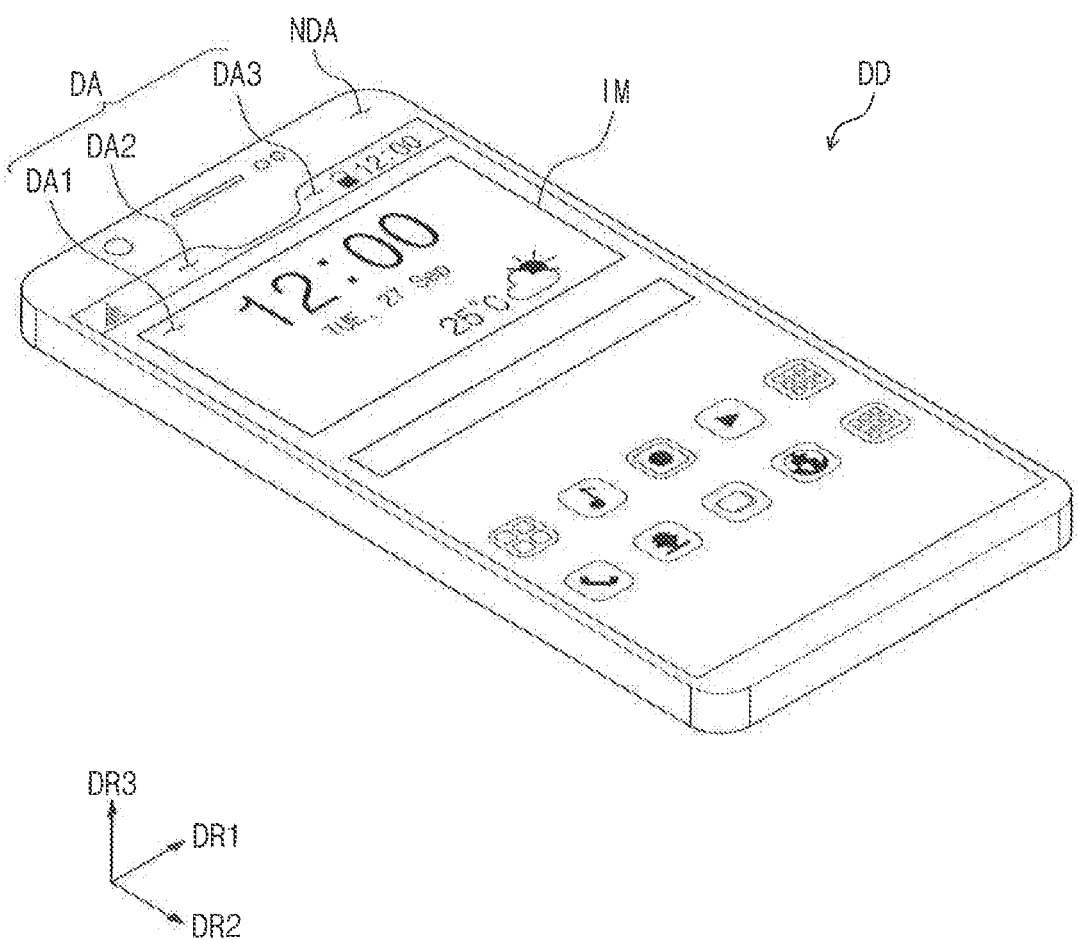
FIG. 1 is a perspective view illustrating a display device according to an exemplary embodiment of the inventive concept.

Exemplary embodiments of the inventive concept provide a display device including an input sensing circuit having uniform input sensing ability for each region of the display device.

Hereinafter, exemplary embodiments of the inventive concept will be described in detail with reference to the accompanying drawings. Like reference numerals may refer to like elements throughout this application.

FIG. 1 is a perspective view illustrating a display device according to an exemplary embodiment of the inventive concept.

FIG. 1 exemplarily illustrates a display device DD as a smartphone. However, the display device DD is not limited thereto, and thus may be a large-size electronic device such as a television, a monitor, or the like, or a small- or medium-size electronic device such as a mobile phone, a tablet, a vehicle navigator, a game machine, a smart watch, or the like.

A display region DA and a non-display region NDA may be defined in the display device DD.

The display region DA in which an image IM is displayed is substantially parallel to a plane defined by a first direction axis DR1 and a second direction axis DR2. A normal direction of the display region DA, e.g., a thickness direction of the display device DD, is indicated by a third direction axis DR3. A front surface (or top surface) and rear surface (or bottom surface) of each member is divided by the third direction axis DR3. However, the directions indicated by the first to third direction axes DR1 to DR3 are relative, and thus may be changed to other directions. Hereinafter, first to third directions which are indicated by the first to third direction axes DR1 to DR3 are referred to by the same reference symbols.

The display region DA may include a first display region DA1, a second display region DA2, and a third display region DA3.

In an exemplary embodiment of the inventive concept, main images desired by a user may be displayed in the first display region DA1. FIG. 1 exemplarily illustrates a clock window and icons as main images.

The second display region DA2 may extend from the first display region DA1 and may display sub images. FIG. 1 exemplarily illustrates an image corresponding to a reception state of an antenna as a sub image displayed in the second display region DA2.

The third display region DA3 may extend from the first display region DA1, may be spaced apart from the second display region DA2, and may display sub images. FIG. 1 exemplarily illustrates an image corresponding to a remaining capacity of a battery and an image corresponding to a current time as sub images displayed in the third display region DA3.

A part of the second display region DA2 and a part of the third display region DA3 may have a curved shape. FIG. 1 exemplarily illustrates that a part of the second display region DA2, which is close to the third display region DA3, has a curved shape, and a part of the third display region DA3, which is close to the second display region DA2, has a curved shape. The shape of the display region DA illustrated in FIG. 1 may be referred to as a trench shape.

In an exemplary embodiment of the inventive concept, an area of the second display region DA2 and an area of the third display region DA3 may be smaller than an area of the first display region DAL The shape of the display region DA1 illustrated in FIG. 1 is exemplary, and thus may be modified as necessary.

The non-display region NDA is adjacent to the display region DA, and does not display the image IM. A bezel region of the display device DD may be defined by the non-display region NDA.

The non-display region NDA may surround the display region DA. However, the inventive concept is not limited thereto, and thus the shape of the display region DA and the shape of the non-display region NDA may be designed in a different manner.

FIGS. 2A to 2D are cross-sectional views of the display device of FIG. 1 according to exemplary embodiments of the inventive concept. FIGS. 2A to 2D illustrate a cross section defined by the second direction axis DR2 and the third direction axis DR3. FIGS. 2A to 2D simply illustrate the cross section to clarify a laminate of a functional panel and/or functional members included in the display device DD.

Figure 2A:
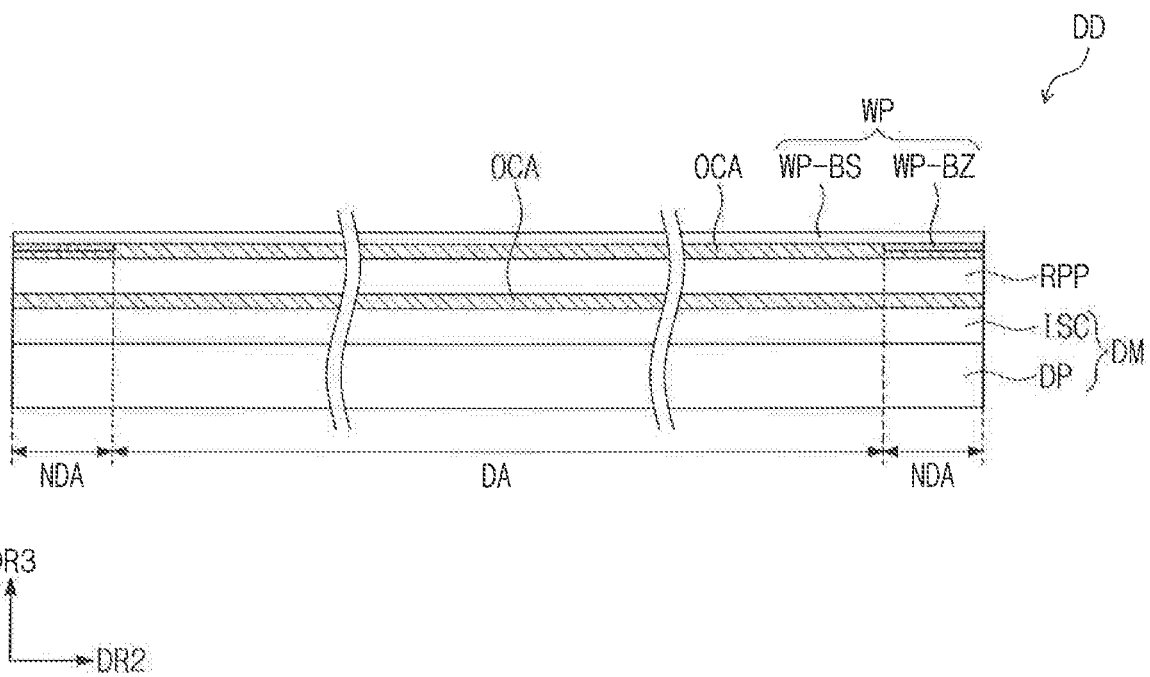
FIGS. 2A to 2D are cross-sectional views of the display device of FIG. 1 according to exemplary embodiments of the inventive concept.

As illustrated in FIG. 2A, the display device DD may include a display panel DP, an input sensing circuit ISC, a reflection preventive member RPP, and a window member WP. The input sensing circuit ISC may be directly disposed on the display panel DP. The term "directly dispose" used herein represents that an additional adhesive layer/adhesive member is not disposed between two components.

The display panel DP and the input sensing circuit ISC directly disposed thereon may be referred to as a display module DM. Optical transparent adhesive members OCA are disposed between the display module DM and the reflection preventive member RPP and between the reflection preventive member RPP and the window member WP.

The display panel DP generates an image, and the input sensing circuit ISC obtains coordinate information of an external input (e.g., a touch event). The display module DM according to an exemplary embodiment of the inventive concept may further include a protective member disposed under the display panel DP. The protective member and the display panel DP may be bonded by an adhesive member. The display devices DD described below and illustrated in FIGS. 2B to 2D may also further include the protective member.

The display panel DP according to an exemplary embodiment of the inventive concept may be an emissive display panel. For example, the display panel DP may be an organic light-emitting display panel or a quantum dot light-emitting display panel. An emission layer of the organic light-emitting display panel may include an organic light-emitting material. An emission layer of the quantum dot light-emitting display panel may include quantum dots, quantum rods, etc. The display panel DP is described as an organic light-emitting display panel below.

The reflection preventive member RPP reduces a reflection ratio of external light incident above the window member WP. The reflection preventive member RPP according to an exemplary embodiment of the inventive concept may include a retarder and a polarizer.

The reflection preventive member RPP according to an exemplary embodiment of the inventive concept may include color filters.

The window member WP according to an exemplary embodiment of the inventive concept includes a base film WP-BS and a light shielding pattern WP-BZ. The base film WP-BS may include a glass substrate and/or a synthetic resin film. The base film WP-BS is not limited to a single layer. The base film WP-BS may include two or more films bonded by an adhesive member.

The light shielding pattern WP-BZ partially overlaps the base film WP-BS. The light shielding pattern WP-BZ may be disposed on a rear surface of the base film WP-BS to define a bezel region of the display device DD, e.g., the non-display region NDA.

Figure 2B:
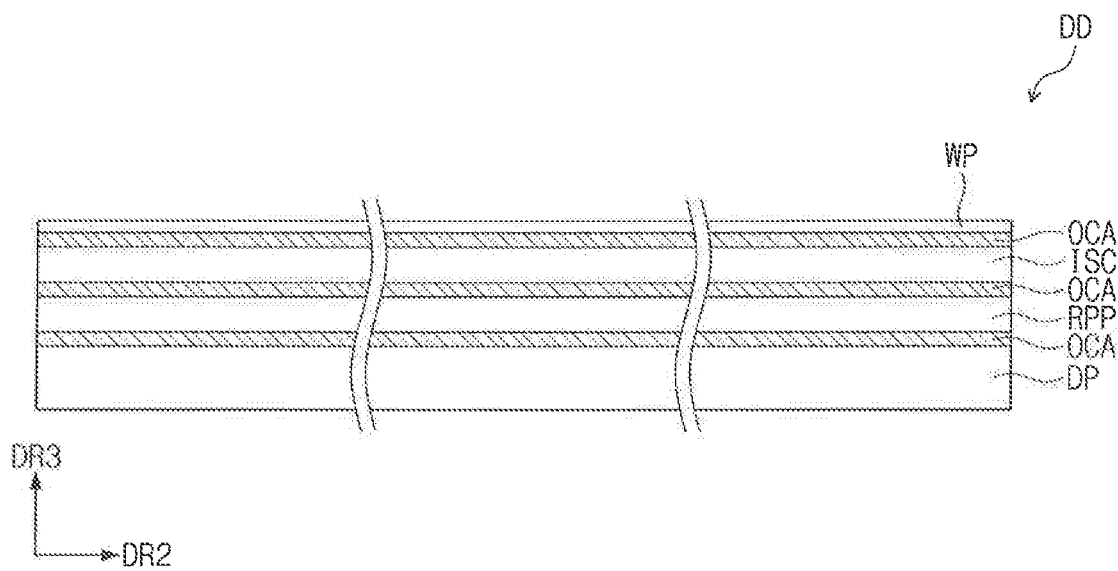
Figure 2C:
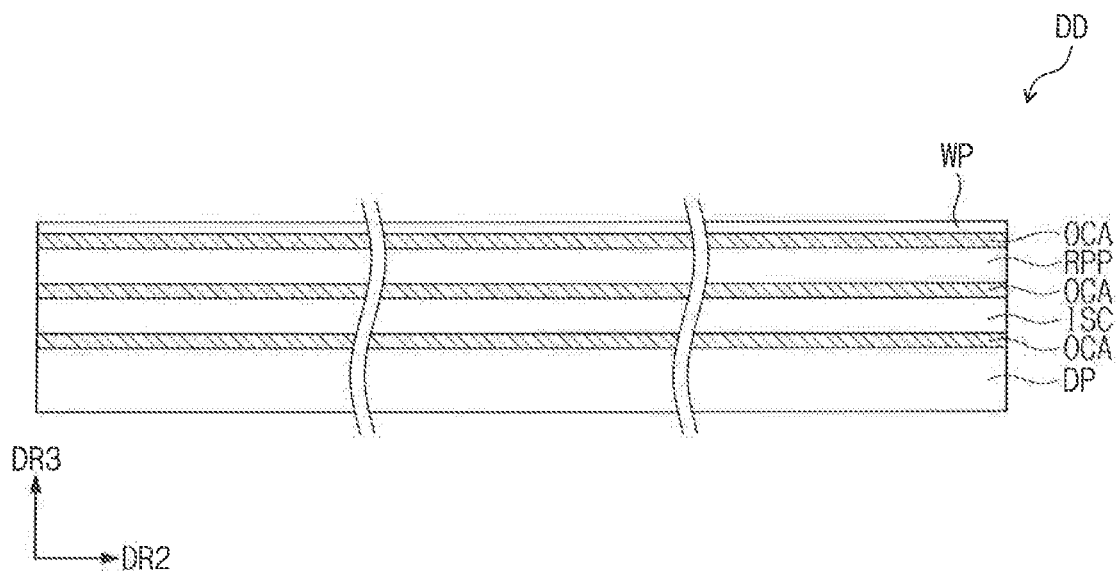
Figure 2D:
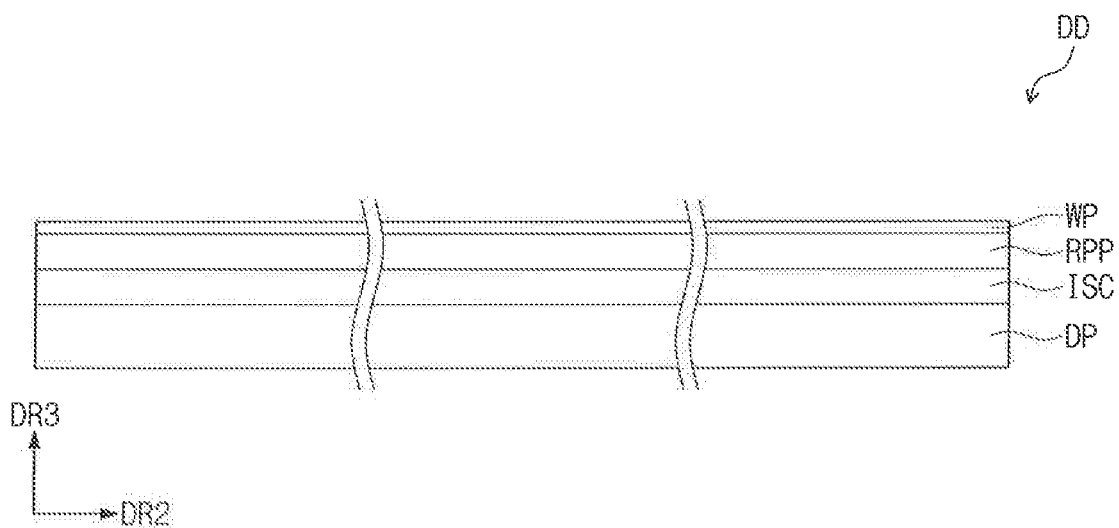

FIGS. 2B to 2D do not separately illustrate the light shielding pattern WP-BZ and the base film WP-BS.

As illustrated in FIG. 2B, the display device DD may include the display panel DP, the input sensing circuit ISC, the reflection preventive member RPP, and the window member WP.

The display panel DP and the reflection preventive member RPP may be bonded by the optical transparent adhesive member OCA. The reflection preventive member RPP and the input sensing circuit ISC may be bonded by the optical transparent adhesive member OCA. The input sensing circuit ISC and the window member WP may be bonded by the optical transparent adhesive member OCA.

Referring to FIG. 2C, positions of the reflection preventive member RPP and the input sensing circuit ISC are switched with each other in comparison with the laminate structure illustrated in FIG. 2B.

As illustrated in FIG. 2D, adhesive members may not be provided in the display device DD, and the display panel DP, the input sensing circuit ISC, the reflection preventive member RPP, and the window member WP may be formed through continuous processes. In an exemplary embodiment of the inventive concept, a lamination order of the input sensing circuit ISC and the reflection preventive member RPP may be changed.

The input sensing circuit ISC may be a touch sensing circuit for sensing a touch of a user, or may be a fingerprint sensing circuit for sensing fingerprint information of a finger of the user.

Figure 3:
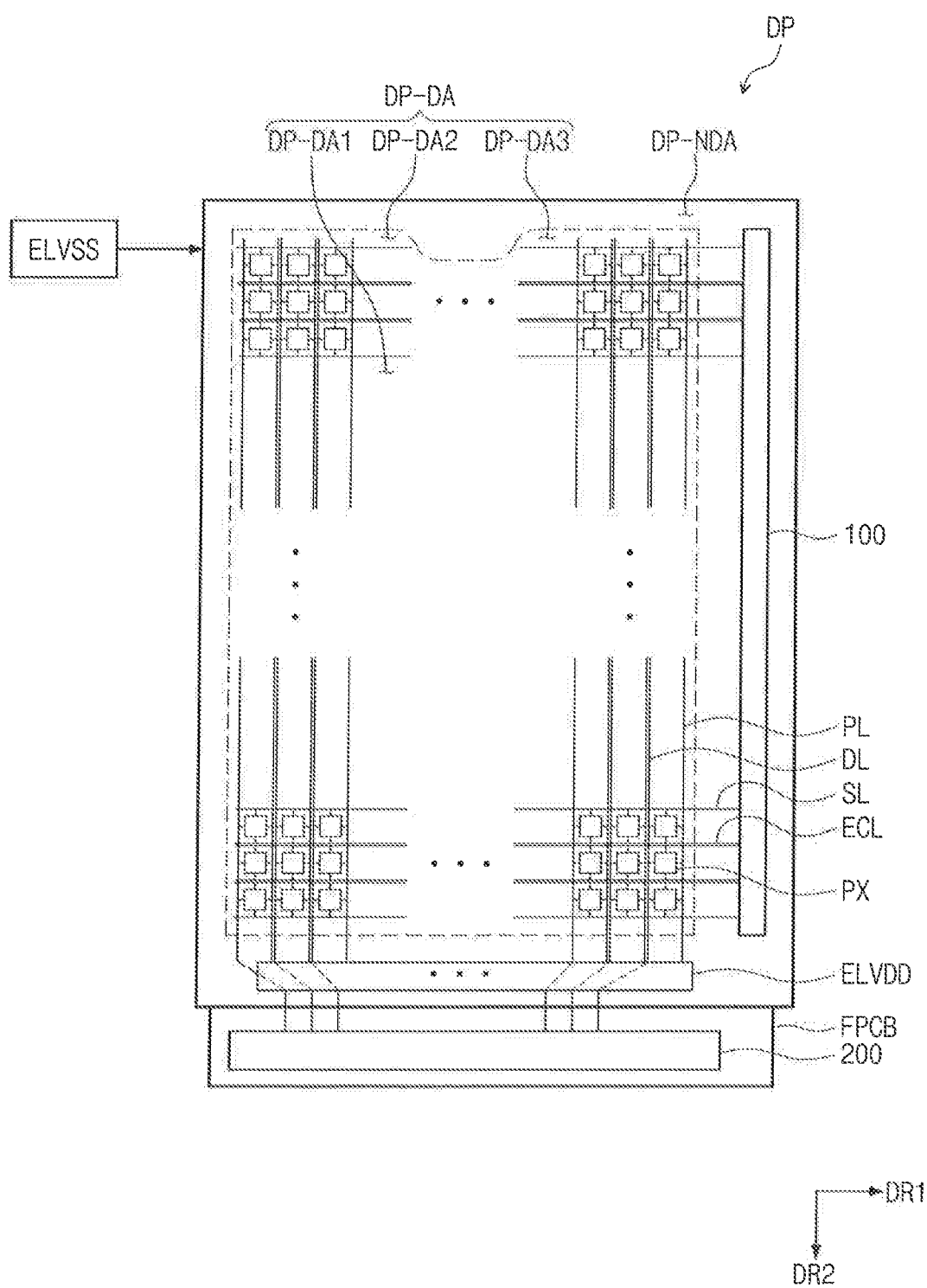
FIG. 3 is a planar diagram illustrating a display panel according to an exemplary embodiment of the inventive concept.

FIG. 3 is a block diagram illustrating a display panel according to an exemplary embodiment of the inventive concept.

A display panel DP includes a display region DP-DA and a non-display region DP-NDA in a planar view. In the present exemplary embodiment, the non-display region DP-NDA may be defined along an edge of the display region DP-DA. The display region DP-DA and the non-display region DP-NDA of the display panel DP may respectively correspond to the display region DA and the non-display region NDA of the display device DD illustrated in FIG. 1.

The display region DP-DA may include a first display region DP-DA1, a second display region DP-DA2, and a third display region DP-DA3.

The first display region DP-DA1 may correspond to the first display region DA1 of FIG. 1, the second display region DP-DA2 may correspond to the second display region DA2 of FIG. 1, and the third display region DP-DA3 may correspond to the third display region DA3 of FIG. 1.

The display panel DP may include a scan driving unit 100, a data driving unit 200, a plurality of scan lines SL, a plurality of emission control lines ECL, a plurality of data lines DL, a plurality of power lines PL, and a plurality of pixels PX. The pixels PX are arranged in the display region DP-DA. Each of the pixels PX includes an organic light-emitting diode (OLED, see FIG. 4) and a pixel circuit CC (see FIG. 4) connected thereto.

The scan driving unit 100 may include a scan driving unit and an emission control driving unit.

The scan driving unit generates scan signals, and sequentially outputs the generated scan signals to the scan lines SL. The emission control driving unit generates emission control signals, and outputs the generated emission control signals to the emission control lines ECL.

In an exemplary embodiment of the inventive concept, the scan driving unit and the emission control driving unit may be configured as a single circuit rather than being separated from each other in the scan driving unit 100.

The scan driving unit 100 may include a plurality of thin-film transistors formed through the same process as for a driving circuit of the pixels PX, for example, a low temperature polycrystalline silicon (LTPS) process or a low temperature polycrystalline oxide (LTPO) process.

The data driving unit 200 outputs data signals to the data lines DL. The data signals are analog voltages corresponding to gradation values of pieces of image data.

In an exemplary embodiment of the inventive concept, the data driving unit 200 may be mounted on a printed circuit board FPCB, and the printed circuit board FPCB may be connected to pads arranged at one side of the data lines DL. However, the inventive concept is not limited thereto, and the data driving unit 200 may be directly mounted on the display panel DP.

The scan lines SL may extend in a first direction DR1 and may be arranged in a second direction DR2. The first direction DR1 and the second direction DR2 may correspond to the first direction axis DR1 and the second direction axis DR2, respectively.

The emission control lines ECL may extend in the first direction DR1 and may be arranged in the second direction DR2. In other words, each of the emission control lines ECL may be disposed substantially in parallel with a corresponding scan line among the scan lines SL.

The data lines DL extend in the second direction DR2 and are arranged in the first direction DR1. The data lines DL may provide the data signals to corresponding pixels PX.

The power lines PL extend in the second direction DR2 and are arranged in the first direction DR1. The power lines PL may provide a first power ELVDD to corresponding pixels PX.

Each of the pixels PX is connected to a corresponding scan line among the scan lines SL, a corresponding emission control line among the emission control lines ECL, a corresponding data line among the data lines DL, and a corresponding power line among the power lines PL.

Figure 4:
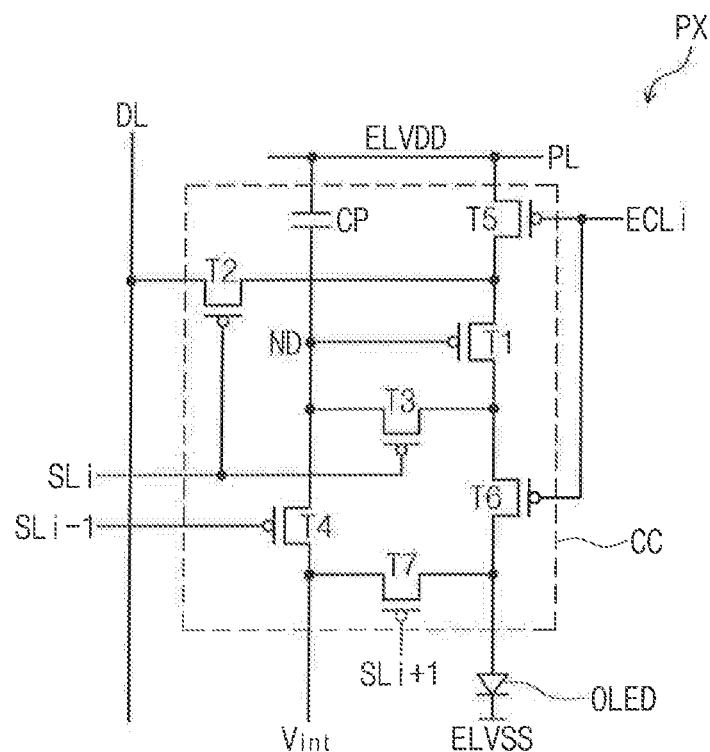
FIG. 4 is a diagram illustrating an equivalent circuit of a pixel of FIG. 3 according to an exemplary embodiment of the inventive concept.
Figure 5:
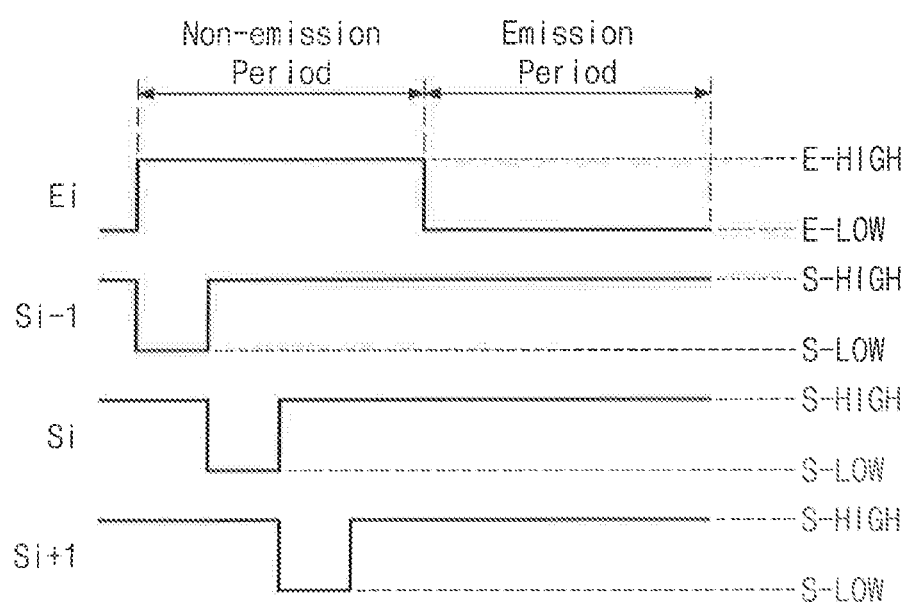
FIG. 5 exemplarily illustrates an emission control signal and scan signals applied to the pixel of FIG. 4 according to an exemplary embodiment of the inventive concept.

FIG. 4 is a diagram illustrating an equivalent circuit of a pixel of FIG. 3 according to an exemplary embodiment of the inventive concept. FIG. 5 exemplarily illustrates an emission control signal and scan signals applied to the pixel of FIG. 4 according to an exemplary embodiment of the inventive concept. FIG. 4 exemplarily illustrates the pixel PX connected to an ith emission control line ECLi, an ith scan line SLi, an (i−1)th scan line SLi−1, and an (i+1)th scan line SLi+1.

The pixel PX may include an organic light-emitting element OLED and a pixel circuit CC. The pixel circuit CC may include a plurality of transistors T1 to T7 and a capacitor CP. The pixel circuit CC controls an amount of current flowing through the organic light-emitting element OLED in response to the data signal.

The organic light-emitting element OLED may emit light of a predetermined luminance according to the amount of current provided from the pixel circuit CC. To this end, a level of the first power ELVDD may be set higher than a level of a second power ELVSS.

Each of the transistors T1 to T7 may include an input electrode (or source electrode), an output electrode (or drain electrode), and a control electrode (or gate electrode). In the present disclosure, for convenience, one of the input electrode and the output electrode may be referred to as a first electrode and the other one may be referred to as a second electrode.

The first electrode of a first transistor T1 is connected to the first power ELVDD via a fifth transistor T5, and the second electrode is connected to an anode electrode of the organic light-emitting element OLED via a sixth transistor T6. The first transistor T1 may be referred to as a driving transistor.

The first transistor T1 controls the amount of current flowing through the organic light-emitting element OLED in response to a voltage applied to the control electrode thereof.

A second transistor T2 is connected between the data line DL and the first electrode of the first transistor T1. The control electrode of the second transistor T2 is connected to the ith scan line SLi. When an ith scan signal Si is provided to the ith scan line SLi, the second transistor T2 is turned on to electrically connect the data line DL to the first electrode of the first transistor T1.

A third transistor T3 is connected between the control electrode and the second electrode of the first transistor T1. The control electrode of the third transistor T3 is connected to the ith scan line SLi. When the ith scan signal Si is provided to the ith scan line SLi, the third transistor T3 is turned on to electrically connect the control electrode and the second electrode of the first transistor T1. Therefore, when the third transistor T3 is turned on, the first transistor T1 is diode-connected.

A fourth transistor T4 is connected between a node ND and an initialization power generation unit. The control electrode of the fourth transistor T4 is connected to the (i−1)th scan line SLi−1. When an (i−1)th scan signal Si−1 is provided to the (i−1)th scan line SLi−1, the fourth transistor T4 is turned on to provide an initialization voltage Vint to the node ND.

The fifth transistor T5 is connected between the power line PL and the first electrode of the first transistor T1. The control electrode of the fifth transistor T5 is connected to the ith emission control line ECLi.

The sixth transistor T6 is connected between the second electrode of the first transistor T1 and the anode electrode of the organic light-emitting element OLED. The control electrode of the sixth transistor T6 is connected to the ith emission control line ECLi.

A seventh transistor T7 is connected between the initialization power generation unit and the anode electrode of the organic light-emitting element OLED. The control electrode of the seventh transistor T7 is connected to the (i+1)th scan line SLi+1. When an (i+1)th scan signal Si+1 is provided to the (i+1)th scan line SLi+1, the seventh transistor T7 is turned on to provide the initialization voltage Vint to the anode electrode of the organic light-emitting element OLED.

The seventh transistor T7 may improve a block color reproduction ability of the pixel PX. In detail, when the seventh transistor T7 is turned on, a parasitic capacitor of the organic light-emitting element OLED is discharged. Therefore, when realizing black color luminance, the organic light-emitting element OLED does not emit light due to a leakage current from the first transistor T1, and thus the black color reproduction ability may be improved.

In addition, although FIG. 4 illustrates the control electrode of the seventh transistor T7 as being connected to the (i+1)th scan line SLi+1, the inventive concept is not limited thereto. In an exemplary embodiment of the inventive concept, the control electrode of the seventh transistor T7 may be connected to the ith scan line SLi or the (i−1)th scan line SLi−1.

FIG. 4 exemplarily illustrates PMOS transistors, but the inventive concept is not limited thereto. In an exemplary embodiment of the inventive concept, the pixel PX may be configured with NMOS transistors. In an exemplary embodiment of the inventive concept, the pixel PX may be configured with a combination of NMOS transistors and PMOS transistors.

The capacitor CP is connected between the power line PL and the node ND. The capacitor CP stores a voltage corresponding to the data signal. The amount of current flowing through the first transistor T1 when the fifth transistor T5 and the sixth transistor T6 are turned on may be determined according to the voltage stored in the capacitor CP.

The structure of the pixel PX is not limited to the structure illustrated in FIG. 4. In an exemplary embodiment of the inventive concept, the pixel PX may be configured in various forms for allowing the organic light-emitting element OLED to emit light.

Referring to FIG. 5, an ith emission control signal Ei may have a high level E-HIGH or a low level E-LOW. Each of the (i−1)th, ith, and (i+1)th scan signals SLi−1, SLi, and SLi+1 may have a high level S-HIGH or a low level S-LOW.

When the emission control signal Ei has the high level E-HIGH, the fifth transistor T5 and the sixth transistor T6 are turned off. When the fifth transistor T5 is turned off, the power line PL is electrically disconnected from the first electrode of the first transistor T1. When the sixth transistor T6 is turned off, the second electrode of the first transistor T1 is electrically disconnected from the anode electrode of the organic light-emitting element OLED. Therefore, while the ith emission control signal Ei having the high level E-HIGH is provided to the ith emission control line ECLi, the organic light-emitting element OLED does not emit light.

Thereafter, when the (i−1)th scan signal Si−1 provided to the (i−1)th scan line SLi−1 has the low level S-LOW, the fourth transistor T4 is turned on. When the fourth transistor T4 is turned on, the initialization voltage Vint is provided to the node ND.

When the ith scan signal Si provided to the ith scan line SLi has the low level S-LOW, the second transistor T2 and the third transistor T3 are turned on.

When the second transistor T2 is turned on, the data signal is provided to the first electrode of the first transistor T1. Here, since the ND is initialized by the initialization voltage Vint, the first transistor T1 is turned on. When the first transistor T1 is turned on, a voltage corresponding to the data signal is provided to the node ND. Here, the capacitor CP stores the voltage corresponding to the data signal.

When the (i+1)th scan signal Si+1 provided to the (i+1)th scan line SLi+1 has the low level S-LOW, the seventh transistor T7 is turned on.

When the seventh transistor T7 is turned on, the initialization voltage Vint is provided to the anode electrode of the organic light-emitting element OLED so that the parasitic capacitor of the organic light-emitting element OLED is discharged.

When the ith emission control signal Ei provided to the ith emission control line ECLi has the low level E-LOW, the fifth transistor T5 and the sixth transistor T6 are turned on. When the fifth transistor T5 is turned on, the first power ELVDD is provided to the first electrode of the first transistor T1. When the sixth transistor T6 is turned on, the second electrode of the first transistor T1 is electrically connected to the anode electrode of the organic light-emitting element OLED. Therefore, the organic light-emitting element OLED generates light of a predetermined luminance according to the amount of current provided to the organic light-emitting element OLED.

Figure 6:
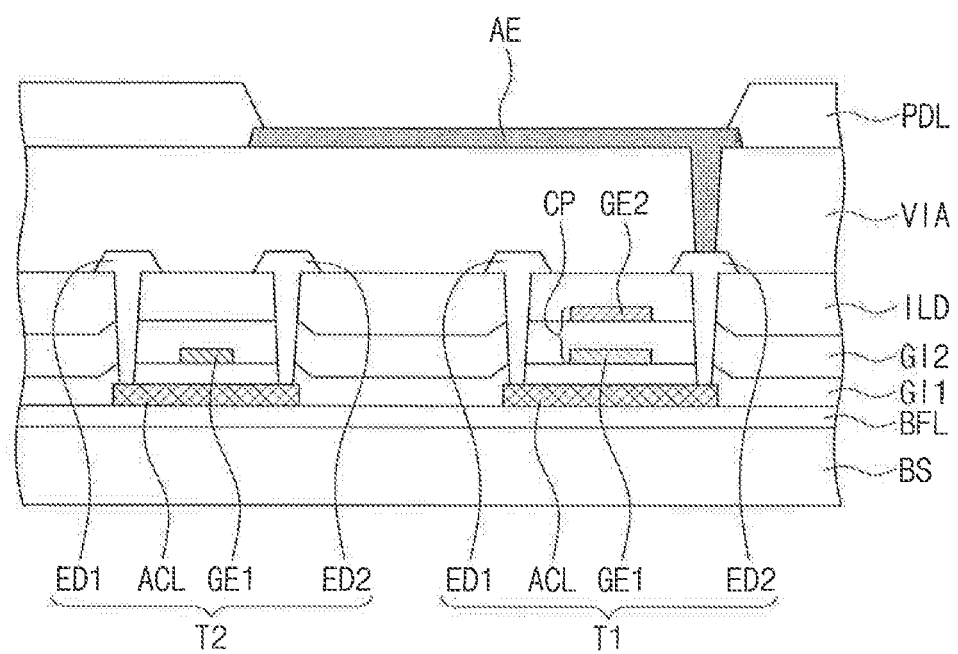
FIG. 6 is a cross-sectional view of a part of the pixel of FIG. 4 according to an exemplary embodiment of the inventive concept.

FIG. 6 is a cross-sectional view of a part of the pixel of FIG. 4 according to an exemplary embodiment of the inventive concept. FIG. 6 exemplarily illustrates the first transistor T1 and the second transistor T2, but the structures of the first transistor T1 and the second transistor T2 are not limited thereto. Although FIG. 6 illustrates that the second electrode ED2 of the first transistor T1 is in direct contact with an anode electrode AE of the pixel PX in a cross-sectional view, the first transistor T1 may be actually connected to the anode electrode AE of the pixel PX via the sixth transistor T6 as illustrated in FIG. 4. However, the inventive concept is not limited thereto, and thus, in an exemplary embodiment of the inventive concept, the second electrode ED2 of the first transistor T1 may be in direct contact with the anode electrode AE of the pixel PX.

The display panel DP (see FIG. 3) may include a base substrate BS, a buffer layer BFL, gate insulating layers GI1 and GI2, an interlayer dielectric ILD, a circuit insulating layer VIA, and a pixel defining layer PDL.

The buffer layer BFL is disposed on one surface of the base substrate BS.

The buffer layer BFL prevents impurities which are present in the base substrate BS from being introduced into the pixel PX during a manufacturing process. In particular, the buffer layer BFL prevents the impurities from diffusing to active parts ACL of the transistors T1 and T2 included in the pixel PX.

The impurities may be externally introduced, or may be generated due to thermal decomposition of the base substrate BS. The impurities may be gas or sodium discharged from the base substrate BS. Furthermore, the buffer layer BFL blocks external moisture from being introduced into the pixel PX.

The active parts ACL of the transistors T1 and T2 are arranged on the buffer layer BFL. Each of the active parts ACL may include polysilicon or amorphous silicon. The active parts ACL may include a metal oxide semiconductor.

The active parts ACL may include a channel region serving as a passage through which electrons or holes move, and first and second ion doped regions with the channel region therebetween.

A first gate insulating layer GI1 covering the active parts ACL is disposed on the buffer layer BFL. The first gate insulating layer GI1 includes an organic film and/or inorganic film. The first gate insulating layer GI1 may include a plurality of inorganic thin films. The plurality of inorganic thin films may include a silicon nitride layer and a silicon oxide layer.

Control electrodes GE1 of the transistors T1 and T2 are arranged on the first gate insulating layer GI1. The control electrode GE1 of the first transistor T1 may be either of two electrodes included in the capacitor CP. At least a portion of the scan lines SL (see FIG. 3) and the emission control lines ECL (see FIG. 3) may be arranged on the first gate insulating layer GI1.

A second gate insulating layer GI2 covering the control electrodes GE1 is disposed on the first gate insulating layer GIL The second gate insulating layer GI2 includes an organic film and/or inorganic film. The second gate insulating layer GI2 may include a plurality of inorganic thin films. The plurality of inorganic thin films may include a silicon nitride layer and a silicon oxide layer.

The other electrode (an electrode GE2) among the two electrodes included in the capacitor CP (see FIG. 4) may be disposed on the second gate insulating layer GI2. In other words, the control electrode GE1 disposed on the first gate insulating layer GI1 and the electrode GE2 disposed on the second gate insulating layer GI2 may overlap to form the capacitor CP illustrated in FIG. 4. However, the structure in which the electrodes of the capacitor CP are arranged is not limited thereto.

The interlayer dielectric ILD covering the electrode GE2 is disposed on the second gate insulating layer GI2. The interlayer dielectric ILD includes an organic film and/or an inorganic film. The interlayer dielectric ILD may include a plurality of inorganic thin films. The plurality of inorganic thin films may include a silicon nitride layer and a silicon oxide layer.

At least a portion of the data lines DL (see FIG. 3) and the power lines PL (see FIG. 3) may be arranged on the interlayer dielectric ILD. A first electrode ED1 and the second electrode ED2 of each of the transistors T1 and T2 may be arranged on the interlayer dielectric ILD.

The first electrode ED1 and the second electrode ED2 may be respectively connected to corresponding active parts ACL via through-holes passing through the gate insulating layers GI1 and GI2 and the interlayer dielectric ILD.

The circuit insulating layer VIA covering the first electrodes ED1 and the second electrodes ED2 is disposed on the interlayer dielectric ILD. The circuit insulating layer VIA includes an organic film and/or an inorganic film. The circuit insulating layer VIA may provide a planar surface.

The pixel defining layer PDL and the organic light-emitting element OLED (see FIG. 4) are arranged on the circuit insulating layer VIA. For convenience, FIG. 6 only illustrates the anode electrode AE of the organic light-emitting element OLED. The organic light-emitting element OLED may further include a hole transport region, an emission layer, an electron transport region, and a cathode, in addition to the anode electrode AE. The display panel DP may include a thin film encapsulation layer for encapsulating the organic light-emitting element OLED.

Figure 7A:
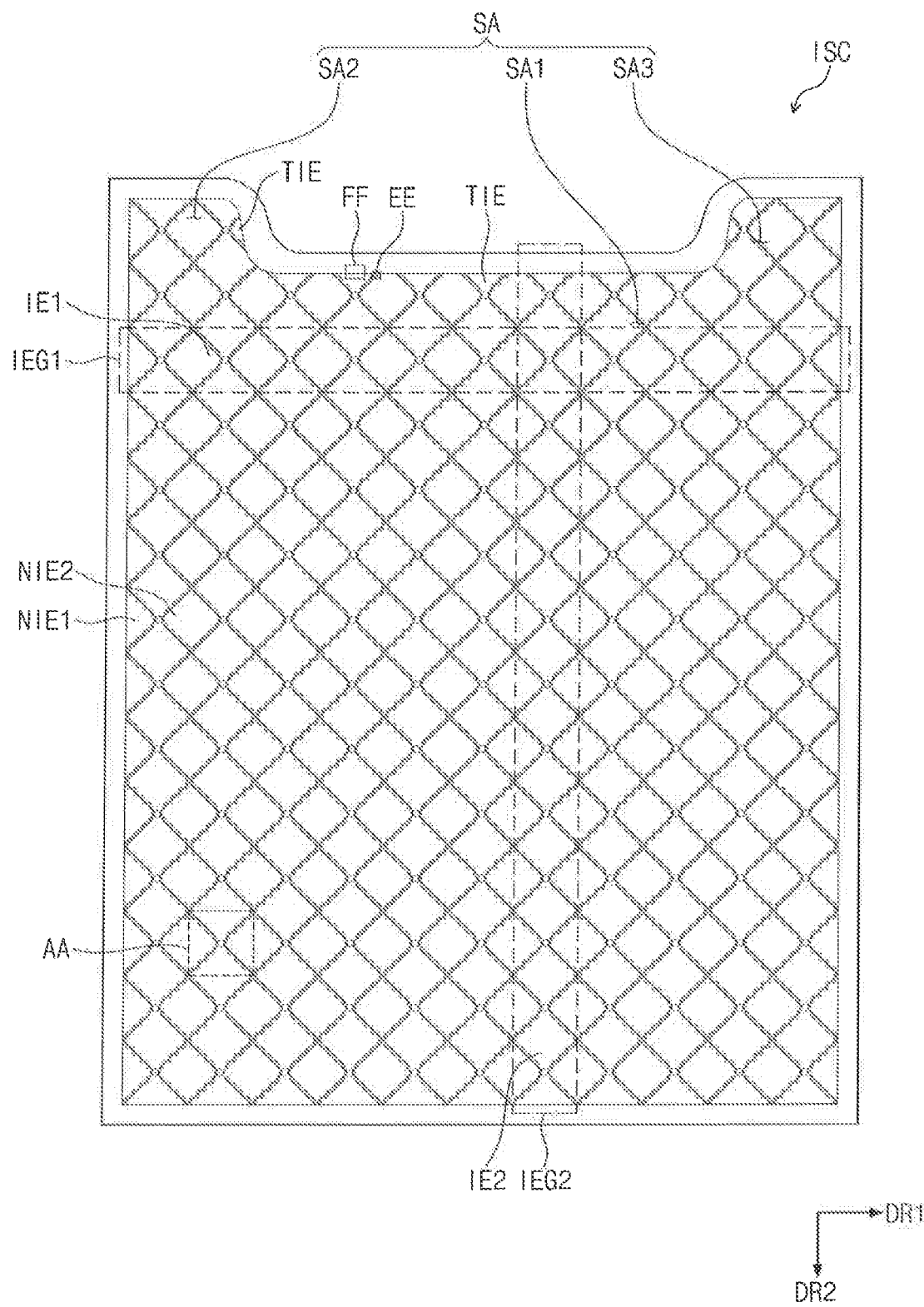
FIG. 7A is a planar view illustrating an input sensing circuit according to an exemplary embodiment of the inventive concept.
Figure 7B:
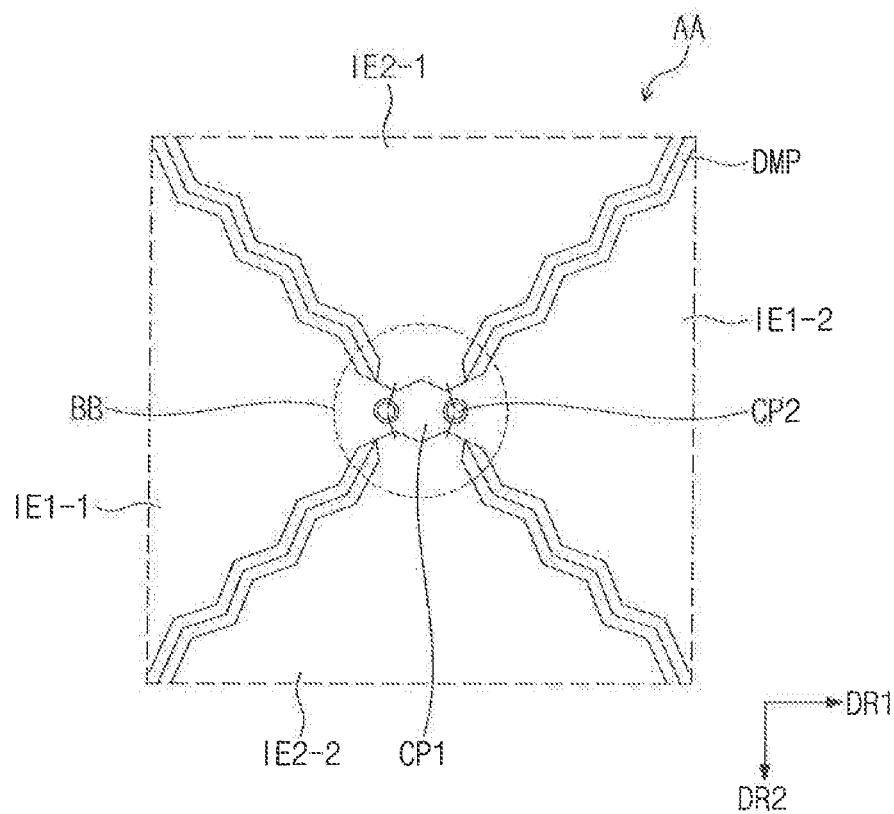
FIG. 7B is an enlarged view of a portion AA illustrated in FIG. 7A according to an exemplary embodiment of the inventive concept.
Figure 7C:
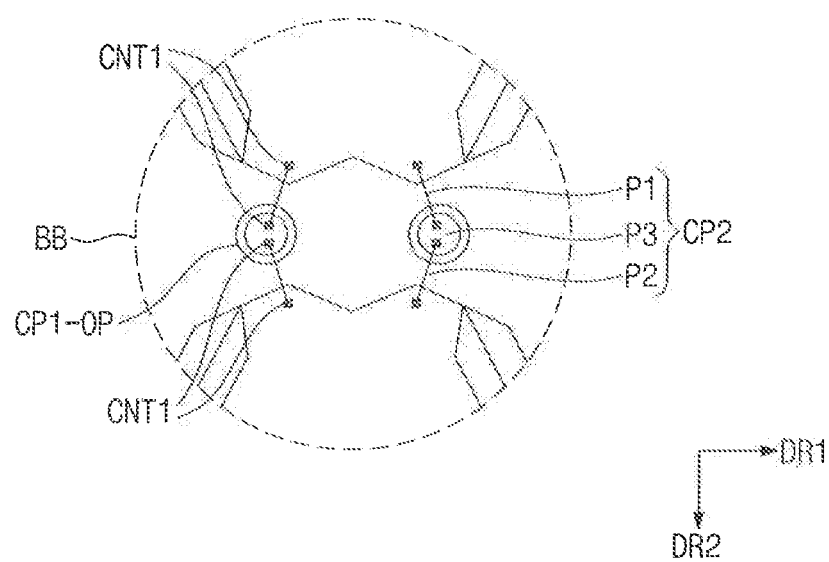
FIG. 7C is an enlarged view of a portion BB illustrated in FIG. 7B according to an exemplary embodiment of the inventive concept.

FIG. 7A is a planar view illustrating an input sensing circuit according to an exemplary embodiment of the inventive concept. FIG. 7B is an enlarged view of a portion AA illustrated in FIG. 7A according to an exemplary embodiment of the inventive concept. FIG. 7C is an enlarged view of a portion BB illustrated in FIG. 7B according to an exemplary embodiment of the inventive concept.

An input sensing region SA, in which an external input may be sensed, may be defined in the input sensing circuit ISC. The input sensing region SA may include a first input sensing region SA1, a second input sensing region SA2, and a third input sensing region SA3.

The first input sensing region SA1 may correspond to the first display region DA1 of FIG. 1, the second input sensing region SA2 may correspond to the second display region DA2 of FIG. 1, and the third input sensing region SA3 may correspond to the third display region DA3 of FIG. 1. In other words, the first input sensing region SA1 may overlap the first display region DP-DA1 of FIG. 3, the second input sensing region SA2 may overlap the second display region DP-DA2 of FIG. 3, and the third input sensing region SA3 may overlap the third display region DP-DA3 of FIG. 3.

The input sensing circuit ISC may include first sensor groups IEG1 and second sensor groups IEG2. The first sensor groups IEG1 and the second sensor groups IEG2 may be referred to as a sensor unit.

The first sensor groups IEG1 may extend in the first direction DR1 and may be arranged in the second direction DR2. Each of the first sensor groups IEG1 may include a plurality of first sensors IE1. For example, the first sensor IE1 may be a receive (Rx) sensor.

The second sensor groups IEG2 may extend in the second direction DR2 and may be arranged in the first direction DR1. Each of the second sensor groups IEG2 may include a plurality of second sensors IE2. For example, the second sensor IE2 may be a transmit (Tx) sensor.

In an exemplary embodiment of the inventive concept, each of the first sensors IE1 and the second sensors IE2 may include indium tin oxide or indium zinc oxide. However, the inventive concept is not limited thereto, and for example, each of the first sensors IE1 and the second sensors IE2 may include molybdenum (Mo).

In an exemplary embodiment of the inventive concept, each of the first sensors IE1 may be capacitive-coupled to an adjacent second sensor IE2 among the second sensors IE2 to form a capacitance. The input sensing circuit ISC may sense a change in the capacitance formed between the first sensors IE1 and the second sensors IE2 to determine whether an input is externally applied.

Dummy patterns DMP may be arranged between the first sensors IE1 and the second sensors IE2. The dummy patterns DMP may be spaced apart from the first sensors IE1 and the second sensors IE2. The dummy patterns DMP may be insulated from the first sensors IE1 and the second sensors IE2. Since the dummy patterns DMP are arranged, visibility of a boundary region between the first sensors IE1 and the second sensors IE2 may be reduced.

In an exemplary embodiment of the inventive concept, the dummy patterns DMP may include indium tin oxide or indium zinc oxide.

In an exemplary embodiment of the inventive concept, each of the first sensors IE1 and the second sensors IE2 may be referred to as one among a first normal sensor NIE1, a second normal sensor NIE2, and an atypical sensor TIE according to an area of each of the first sensors IE1 and the second sensors IE2.

Sensors having a rhombus shape and a first area, among the first sensors IE1 and the second sensors IE2, may be referred to as the first normal sensors NIE1.

Sensors having an isosceles triangle shape and a second area which is half of the first area, among the first sensors IE1 and the second sensors IE2, may be referred to as the second normal sensors NIE2.

Sensors having a shape obtained by removing a portion of the first normal sensor NIE1 or a portion of the second normal sensor NIE2, among the first sensors IE1 and the second sensors IE2, may be defined as the atypical sensors TIE. The atypical sensor TIE may have a third area different from the first area and the second area. For example, the third area may be about 10 percent to about 49 percent of the first area. Alternatively, the third area may be about 10 percent to about 49 percent of the second area.

The sensors referred to as the atypical sensors TIE, among the first sensors IE1 and the second sensors IE2, may be arranged on a periphery of the sensor unit.

The portion AA of FIG. 7A, illustrated in FIG. 7B, is referred to as a unit region AA in which the input sensing circuit ISC senses an external input. The unit region AA includes a left first sensor IE1-1, a right first sensor IE1-2, an upper second sensor IE2-1, and a lower second sensor IE2-2.

In the unit region AA, the first sensors IE1-1 and IE1-2 form a capacitance with the second sensors IE2-1 and IE2-2.

The left first sensor IE1-1 and the right first sensor IE1-2 may be electrically connected by a first connection part CP1.

The upper second sensor IE2-1 and the lower second sensor IE2-2 may be electrically connected by a second connection part CP2. The second connection part CP2 may include a plurality of patterns P1, P2, and P3.

Each of a first pattern P1 and a second pattern P2 may electrically connect a third pattern P3 to the second sensors IE2-1 and IE2-2 via first contact holes CNT1.

An opening CP1-OP is formed in the first connection part CP1. The third pattern P3 is disposed inside the opening CP1-OP.

An antistatic pattern may be connected to each of the upper second sensor IE2-1 and the lower second sensor IE2-2. The antistatic pattern may guide static electricity to a vertex thereof to prevent disconnection of the second connection part CP2.

Figure 8A:
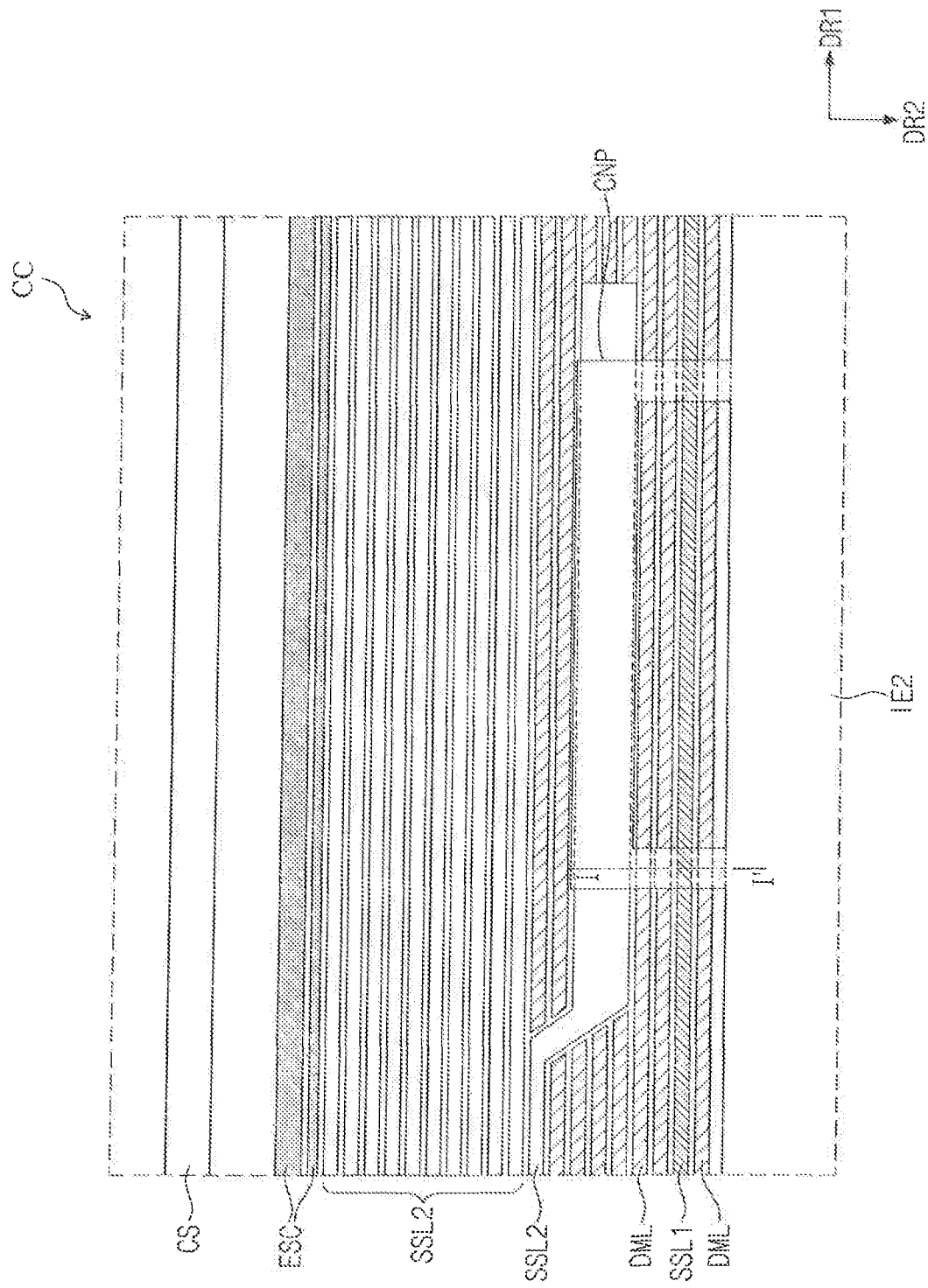
FIG. 8A is an enlarged view of a portion FF illustrated in FIG. 7A according to an exemplary embodiment of the inventive concept.
Figure 8B:
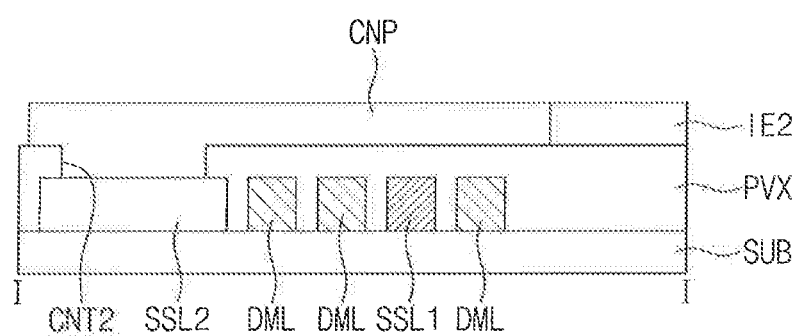
FIG. 8B illustrates a part of a cross section taken along line I-I' of FIG. 8A according to an exemplary embodiment of the inventive concept.

FIG. 8A is an enlarged view of a portion FF illustrated in FIG. 7A according to an exemplary embodiment of the inventive concept. FIG. 8B illustrates a part of a cross section taken along line I-I' of FIG. 8A according to an exemplary embodiment of the inventive concept.

Referring to FIG. 8A, the portion FF may include a part of the second sensor IE2, a connection pattern CNP, dummy lines DML, a first signal line SSL1, second signal lines SSL2, antistatic lines ESD, and a sealing member CS. Here, the second sensor IE2 may be the atypical sensor TIE (see FIG. 7A).

The dummy lines DML may serve to prevent adjacent lines from being coupled to each other. For example, a portion of the dummy lines DML may prevent the sensors IE1 and IE2 (see FIG. 7A) from being coupled to the first signal line SSL1. Furthermore, a portion of the dummy lines DML may prevent the first signal line SSL1 from being coupled to the second signal lines SSL2.

At least one of the dummy lines DML may be disposed on a periphery of the sensors IE1 and IE2 (see FIG. 7A), and may extend along a part of a boundary between the display region DA (see FIG. 1) and the non-display region NDA (see FIG. 1). At least one of the dummy lines DML overlaps the non-display region NDA (see FIG. 1).

A part of at least one of the dummy lines DML may be disposed between the second input sensing region SA2 (see FIG. 7A) and the third input sensing region SA3 (see FIG. 7A).

At least one of the dummy lines DML may be disposed adjacent to the second sensor IE2, on a plane defined by the first direction DR1 and the second direction DR2.

In an exemplary embodiment of the inventive concept, the dummy lines DML may include molybdenum (Mo).

The first signal line SSL1 is electrically connected to the first sensors IE1 (see FIG. 7). In detail, the first signal line SSL1 illustrated in FIG. 8A may be a line for connecting one of the first sensors IE1 arranged in the second input sensing region SA2 to one of the first sensors IE1 arranged in the third input sensing region SA3. The first signal line SSL1 illustrated in FIG. 8A may be referred to as a connection line.

FIG. 8A exemplarily illustrates a single first signal line SSL1, but the inventive concept is not limited thereto, and a plurality of the first signal lines SSL1 may be provided.

The second signal lines SSL2 may be electrically connected to corresponding second sensors IE2 (see FIG. 7A) among the second sensors IE2 (see FIG. 7A).

Referring to FIG. 8A, a direction in which a part of the first signal line SSL1 extends, a direction in which a part of the second signal line SSL2 extends, and a direction in which a part of the dummy line DML extends may be substantially the same.

Referring to FIG. 8B, the dummy lines DML, the first signal line SSL1, and the second signal line SSL2 may be arranged on a base part SUB.

In an exemplary embodiment of the inventive concept, the base part SUB may be a thin film encapsulation layer of the display panel DP. However, the base part SUB is not limited thereto. Thus, in an exemplary embodiment of the inventive concept, the base part SUB may be a film including an organic material or inorganic material, which is one of components of the input sensing circuit ISC (see FIG. 7A).

An insulating layer PVX covering the dummy lines DML, the first signal line SSL1, and the second signal line SSL2 may be arranged on the base part SUB. The insulating layer PVX may include an inorganic material or organic material.

A second contact hole CNT2, which exposes a part of the second signal line SSL2, may be formed in the insulating layer PVX.

The second sensor IE2 may be disposed on the insulating layer PVX. Although FIG. 8B only illustrates the second sensor IE2, the first sensor IE1 (see FIG. 7A) may also be disposed on the insulating layer PVX in an exemplary embodiment of the inventive concept.

A connection pattern CNP may extend from the second sensor IE2 and may be electrically connected to the second signal line SSL2 via the second contact hole CNT2.

The antistatic lines ESD may be arranged on a periphery of the second signal lines SSL2 to protect the components of the input sensing circuit ISC from static electricity applied externally.

The sealing member CS may be arranged on a periphery of the antistatic lines ESD to protect the components of the input sensing circuit ISC from moisture or oxygen applied externally.

Figure 9A:
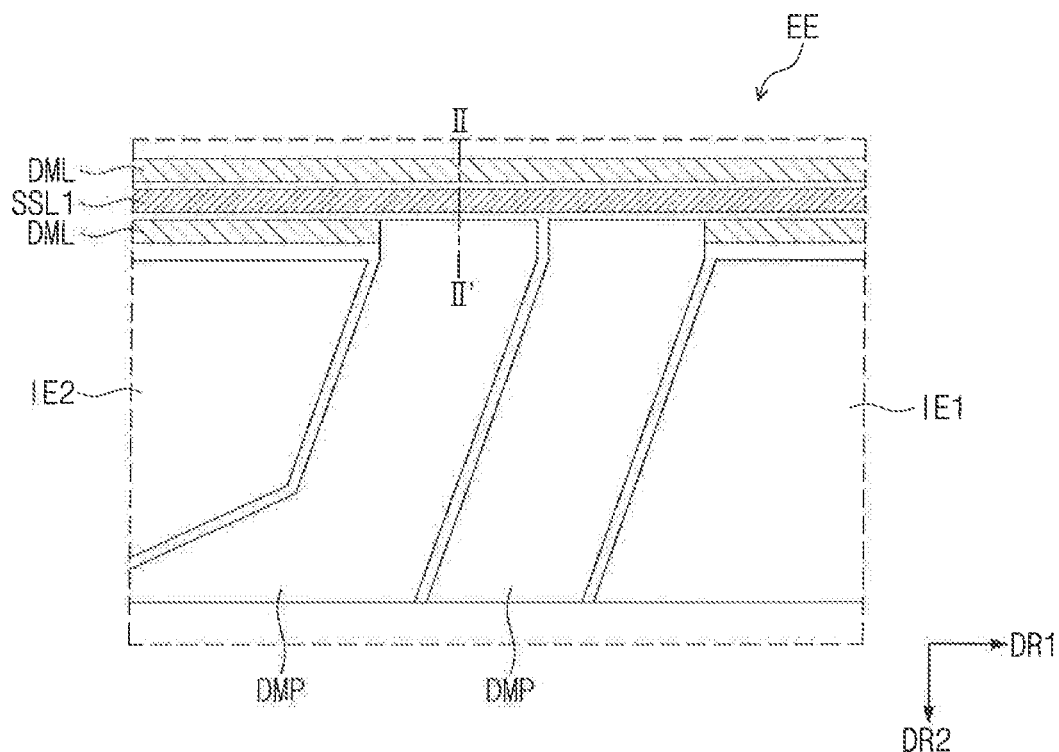
FIG. 9A is an enlarged view of a portion EE illustrated in FIG. 7A according to an exemplary embodiment of the inventive concept.
Figure 9B:
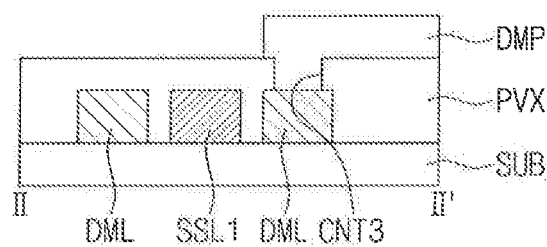
FIG. 9B illustrates a part of a cross section taken along line II-II' of FIG. 9A according to an exemplary embodiment of the inventive concept.

FIG. 9A is an enlarged view of a portion EE illustrated in FIG. 7A according to an exemplary embodiment of the inventive concept. FIG. 9B illustrates a part of a cross section taken along line II-II' of FIG. 9A according to an exemplary embodiment of the inventive concept.

At least one of the first sensor IE1 and the second sensor IE2 illustrated in FIG. 9A may be a sensor defined as the atypical sensor TIE (see FIG. 7A).

At least one of the dummy patterns DMP arranged between the first sensor IE1 and the second sensor IE2 may be electrically connected to the dummy line DML. The dummy line DML electrically connected to the dummy pattern DMP may be one disposed closest to the second sensor IE2 among the dummy lines DML.

Referring to FIG. 9B, the dummy pattern DMP may be connected to the dummy line DML via a third contact hole CNT3 formed in the insulating layer PVX. Accordingly, a parasitic capacitance generated between the dummy pattern DMP and the dummy line DML may be removed.

Furthermore, since the parasitic capacitance is removed, the capacitance between the first sensor IE1 and the second sensor IE2 may increase. Therefore, loss of a capacitance, which occurs since at least one of the first sensor IE1 and the second sensor IE2 is the atypical sensor TIE, may be compensated.

When the capacitance of the atypical sensor TIE is compensated, the unit region AA (see FIG. 7B) in which the atypical sensor TIE is not present and a region in which the atypical sensor TIE is present may have similar input detection sensitivity.

Furthermore, when the dummy pattern DMP and the dummy line DML are electrically connected, the number of capacitances to be controlled becomes less than before the connection, and thus the compensation for capacitance may be simplified.

Figure 10:
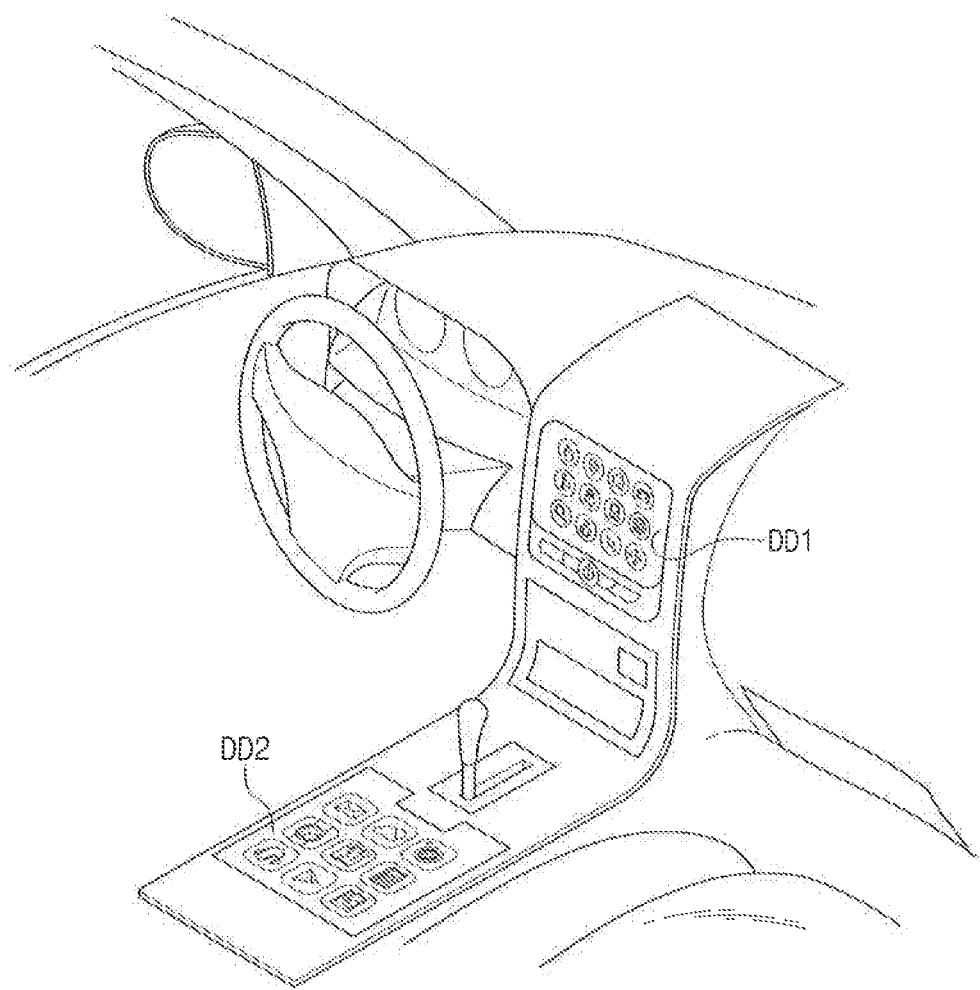
FIGS. 10 and 11 illustrate display devices according to exemplary embodiments of the inventive concept.
Figure 11:
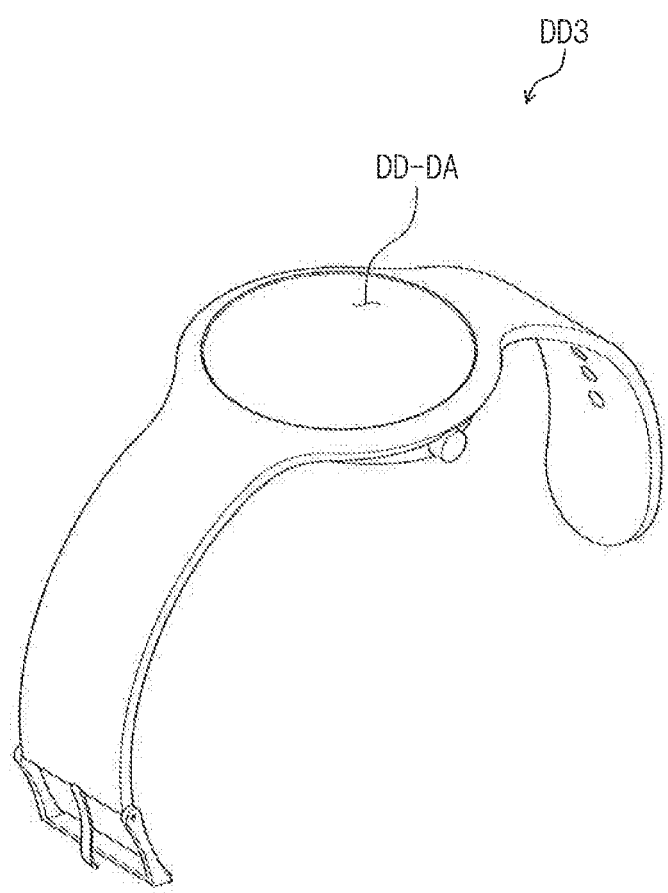

FIGS. 10 and 11 illustrate display devices according to exemplary embodiments of the inventive concept. Various types of display devices DD1 and DD2 may be applied in a vehicle.

FIG. 10 exemplarily illustrates a display device DD1 serving as an embedded navigator and a display device DD2 disposed near a gear stick.

Shapes of the display devices DD1 and DD2 of a vehicle may be changed according to a design of a vehicle. For example, the display device DD1 serving as an embedded navigator may have rounded corners, and the display device DD2 disposed near a gear stick may have a notched upper portion.

A rounded display device may also be applied in a dashboard of a vehicle.

Here, the above-mentioned input sensing circuit ISC may be applied to the display devices DD1 and DD2 to impart excellent ability to sense an external input.

Referring to FIG. 11, a display device DD3 may be a wearable device to be worn on a part of a human body. Although FIG. 11 exemplarily illustrates a watch-type device, the inventive concept is not limited thereto, and the display device DD3 may have various forms to be worn on a body of a user.

The shape of a display region DD-DA of the wearable device may be changed as necessary so that the wearable device may be worn on a body. Therefore, the above-mentioned input sensing circuit ISC may be applied to the display device DD3 to impart excellent ability to sense an external input.

According to exemplary embodiments of the inventive concept, a parasitic capacitance generated due to sensors of an input sensing circuit and other components is removed so that overall uniform capacitances may be formed between sensors.

Accordingly, a display device including an input sensing circuit having uniform sensitivity may be provided.

Although the inventive concept has been shown and described with reference to exemplary embodiments thereof, it is understood that various changes and modifications in form and details can be made thereto by one of ordinary skill in the art without departing from the spirit and scope of the inventive concept as set forth by the following claims.

What is claimed is:

1. A display device comprising:
   a display panel including a display region and a non-display region; and
   an input sensing circuit disposed on the display panel,
   wherein the input sensing circuit comprises:
   a plurality of sensors overlapping the display region and comprising a plurality of first sensors and a plurality of second sensors capacitive-coupled respectively to adjacent first sensors among the plurality of first sensors;
   a plurality of dummy lines disposed among signal lines and sensors, wherein a first dummy line that is disposed closest to the first or second sensors among the plurality of dummy lines is disposed on a periphery of the plurality of sensors, extends along a part of a boundary between the display region and the non-display region, and is insulated from the plurality of sensors, the first dummy line is disposed directly adjacent to a first signal line of the signal lines; and
   a plurality of dummy patterns insulated from the plurality of sensors,
   wherein each of the plurality of dummy patterns is disposed between two adjacent sensors among the plurality of sensors,
   Wherein the first dummy line is electrically connected to at least a portion of the plurality of dummy patterns disposed adjacent to the first dummy fine; and
   wherein only a partial portion of the plurality of dummy lines is electrically connected to the plurality of dummy patterns.

2. The display device of claim 1, wherein at least one dummy line of the plurality of dummy lines overlaps the non-display region.

3. The display device of claim 1, wherein an area of at least one sensor adjacent to the boundary between the display region and the non-display region, among the plurality of sensors, is about 10 percent to about 49 percent of an area of other sensors among the plurality of sensors.

4. The display device of claim 1, wherein the display region comprises:
   a first display region having a first area;
   a second display region having a second area smaller than the first area and extending from the first display region; and
   a third display region having a third area smaller than the first area, extending from the first display region, and spaced apart from the second display region.

5. The display device of claim 4,
   wherein the input sensing circuit includes a first input sensing region overlapping the first display region, a second input sensing region overlapping the second display region, and a third input sensing region overlapping the third display region, and wherein at least one dummy line of the plurality of dummy lines is disposed between the second input sensing region and the third input sensing region.

6. The display device of claim 5, wherein the input sensing circuit further comprises a connection line connecting one sensor disposed in the second input sensing region among the plurality of sensors to one sensor disposed in the third input sensing region among the plurality of sensors.

7. The display device of claim 6, wherein a direction in which the connection line extends is substantially the same as a direction in which the plurality of dummy lines extend.

8. The display device of claim 7, wherein at least one dummy line of the plurality of dummy lines is disposed adjacent to the connection line.

9. The display device of claim 8, wherein at least one dummy line of the plurality of dummy lines is disposed between the connection line and the plurality of sensors.

10. The display device of claim 1, wherein the plurality of dummy lines comprise molybdenum, and the plurality of sensors and the plurality of dummy patterns comprise indium tin oxide.

11. A display device comprising:
a display panel including a display region and a non-display region;
a dummy line disposed on the display panel, overlapping the non-display region, and extending along a part of a boundary between the display region and the non-display region;
an insulating layer covering the dummy line, disposed on the display panel, and including a contact hole exposing a part of the dummy line;
a sensor unit comprising a plurality of sensors disposed on the insulating layer, wherein each of the plurality of sensors is capacitive-coupled to adjacent other sensors of the plurality of sensors; and
a plurality of dummy patterns, each of which is disposed between adjacent sensors among the plurality of sensors that are insulated from one another and is spaced apart from the adjacent sensors,
wherein at least a portion of the plurality of dummy patterns is electrically connected to the dummy line via the contact hole, and wherein the plurality of dummy patterns is configured to remove a parasitic capacitance between the plurality of dummy patterns and the dummy line to increase a capacitance between the plurality of sensors.

12. The display device of claim 11, wherein the dummy line is insulated from the plurality of sensors.

13. The display device of claim 12, wherein the plurality of sensors comprise:
a plurality of first normal sensors, each of which has a first area;
a plurality of second normal sensors, each of which has a second area which is about half of the first area; and
a plurality of atypical sensors, each of which has a third area different from the first area and the second area.

14. The display device of claim 13, wherein the display region comprises:
a first display region;
a second display region extending from the first display region; and
a third display region extending from the first display region and spaced apart from the second display region.

15. The display device of claim 14, further comprising a connection line disposed on the display panel, covered by the insulating layer, and connecting one sensor overlapping the second display region among the plurality of sensors to one sensor overlapping the third display region among the plurality of sensors.

16. The display device of claim 15, wherein a direction in which the connection line extends is substantially the same as a direction in which the dummy line extends.

17. The display device of claim 16, wherein the dummy line is disposed adjacent to the connection line.

18. The display device of claim 17, wherein the dummy line is disposed between the connection line and the plurality of sensors.

19. The display device of claim 13, wherein the plurality of atypical sensors are arranged adjacent to a periphery of the sensor unit,
wherein the dummy line is disposed adjacent to the plurality of atypical sensors.

* * * * *